(12) United States Patent  
Welty

(10) Patent No.: US 6,669,535 B1
(45) Date of Patent: Dec. 30, 2003

(54) PLATFORM TABLE FOR CLEANING PARTS

(75) Inventor: Craig Welty, Battle Ground, WA (US)

(73) Assignee: WaferTech LLC, Camas, WA (US)

( * ) Notice: Subject to any disclaimer, the term of this patent is extended or adjusted under 35 U.S.C. 154(b) by 9 days.

(21) Appl. No.: 09/902,892

(22) Filed: Jul. 12, 2001

(51) Int. Cl.[7] ............................................... B24B 1/00
(52) U.S. Cl. .................... 451/36; 451/269; 451/365; 451/405; 451/380; 29/559; 269/60
(58) Field of Search .................... 451/36, 269, 365, 451/405, 380; 29/559; 269/60, 71, 61

(56) References Cited

U.S. PATENT DOCUMENTS

| | | | | |
|---|---|---|---|---|
| 3,883,128 A | * | 5/1975 | Breese | 269/45 |
| 4,866,796 A | * | 9/1989 | Robinson et al. | 5/607 |
| 4,922,228 A | * | 5/1990 | Jacobson | 340/550 |
| 5,040,716 A | | 8/1991 | Stetz | 228/49.3 |
| 5,186,228 A | * | 2/1993 | Stafford | 144/286.1 |
| 5,503,591 A | * | 4/1996 | Morikawa et al. | 451/75 |
| 5,660,317 A | | 8/1997 | Singer et al. | 228/44.3 |
| 5,685,060 A | * | 11/1997 | Tibbet | 29/559 |
| 5,732,455 A | | 3/1998 | Diede | 29/281.5 |
| 5,785,581 A | * | 7/1998 | Settles | 451/99 |

* cited by examiner

Primary Examiner—Joseph J. Hail, III
Assistant Examiner—Alvin J Grant
(74) Attorney, Agent, or Firm—Duane Morris LLP

(57) ABSTRACT

An apparatus is provided for cleaning parts in a production line. The part is placed on the apparatus at an ergonomically comfortable height and angle with respect to the worker, thus avoiding fatigue, while at the same time providing a faster turn-around time in the production line. The apparatus is especially suited for a semiconductor manufacturing line.

18 Claims, 5 Drawing Sheets

PLATFORM TABLE FOR CLEANING PARTS

BACKGROUND OF THE INVENTION

(1) Field of the Invention

The present invention relates to an apparatus for cleaning parts in a manufacturing line in general, and in particular, to an apparatus for cleaning parts in a semiconductor manufacturing line and, a method of cleaning using the same apparatus.

(2) Description of the Related Art

Cleaning parts in a wafer FAB is usually performed by holding the part of interest in one hand, while applying the cleaning means onto the part with the other hand. A case in point is the cleaning of parts, such as a DPS (Decoupled Plasma System) upper chambers, quartz, or ceramics, by bead, sand-blasting, or $CO_2$ blasting. It has been the experience in the present manufacturing line that more frequently than not, the cleaning of the part while physically holding it in the hand can be quite tiresome, and at times, dangerous. Furthermore, because of fatigue, the part needing longer cleaning can be deprived of the needed time. Also, the parts may need to be held in certain positions for most effective cleaning, and yet, because of the awkwardness of manipulating the hand into those positions the parts may not get the proper cleaning, resulting in faults and other damages. There is, therefore, a need for a part holding apparatus that can hold the part in the desired positions, and at the same time relieve the band of fatigue that would otherwise result by holding it. It is disclosed later in the embodiments of the present invention a tiltable platform table which is cost effective both in reducing turn-around time for parts in the production line, and also ergonomically suited for cleaning parts in a manufacturing line, in general, and in a semiconductor manufacturing line, in particular.

In the prior art, devices such as grips, vices, jigs and others have been designed to hold parts while performing work on them. For example, an apparatus is described by Stetz in U.S. Pat. No. 5,040,716 for supporting and aligning tube sections to be welded together. Here, an elongated supporting, table is provided with a pair of inwardly grooved tracks and various secondary support members are also provided to mate with the tracks and to hold several pipe or tube arrangements utilizing conventional T-fittings, elbow fittings, nozzle fittings, etc. The apparatus permits, among other things, proper alignment and stability during welding.

In U.S. Pat. No. 5,660,317, an exothermic welding jig is described by Singer, et al., where the jig has a handle which may be used as a cane or supporting device in manipulating mold parts. Upper and lower mold parts are included with a crucible fitted on and clamped to the upper mold part. The upper mold part and crucible may be moved as a unit to open and close the mold and also inverted when open for cleaning and inspection. The crucible can quickly be removed or snapped in place, for mold or crucible change-out. A toggle opens and closes the mold set and will hold the molds in any position where released.

A different tube welding jig is disclosed in U.S. Pat. No. 5,732,455 by Diede. The jig comprises a weld head support mounted on a support surface and one or more tube support pedestals having a top groove for supporting a tube alignment with the weld head. The pedestals may be threaded to provide a height adjustment of the pedestals.

The jigs of the prior art, however, are not suitable for cleaning parts in a semiconductor manufacturing line. A different platform table with added advantages is disclosed below.

SUMMARY OF THE INVENTION

It is therefore an object of the present invention to provide an apparatus for cleaning parts in a manufacturing line.

It is another object of this invention to provide an apparatus for relieving fatigue while cleaning parts in a manufacturing line.

It is yet another object of the present invention to provide an apparatus for reducing turn-around time in cleaning parts in a manufacturing line.

It is an overall object of this invention to provide a tiltable platform for securing semiconductor parts while cleaning them at an optimum orientation, and also a method of using the same platform.

These objects are accomplished by providing a base; a plurality of legs affixed onto said base; a tiltable platform disposed over said plurality of legs; said tiltable platform comprising a frame having four edges and four corners; said tiltable platform pivotably disposed on a pivot on a pivot leg of one of said plurality of legs, and on the remaining plurality of legs; said tiltable platform further having two railings spanning opposite said corners and forming a cross at the center of said frame; and clamps that are disposed slidably over said railings.

These objects are further accomplished by providing a parts cleaning platform table comprising a base adjustably connected to a tiltable platform having railings with clamps; raising said base to an ergonomically comfortable position; tilting said tiltable platform to an ergonomically comfortable angle; placing a part onto said railing with clamps; clamping said part onto said railing with said clamps; and cleaning the part.

DESCRIPTION OF THE PREFERRED EMBODIMENTS

Figure 1:
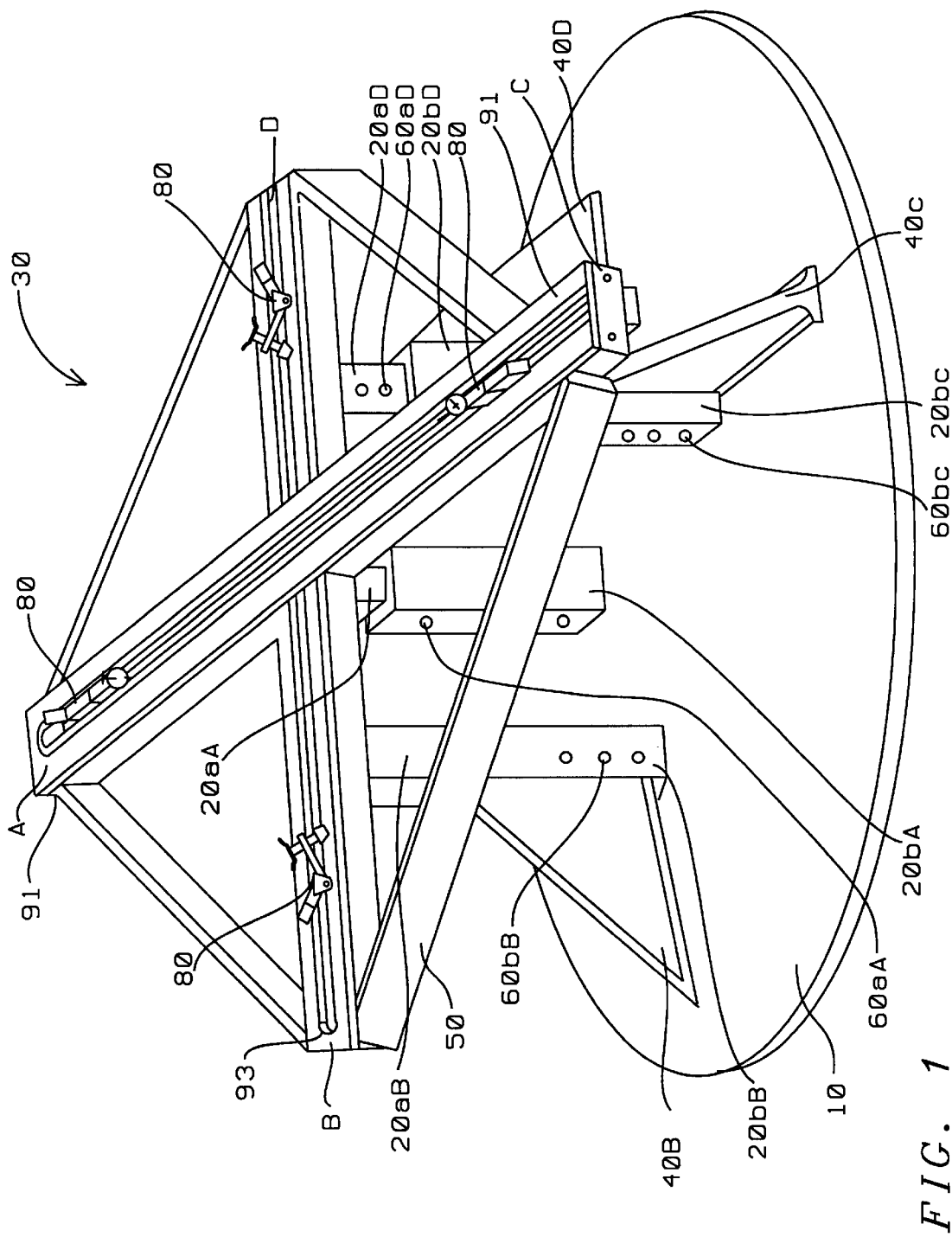
FIG. 1 is a straight-on perspective view of the Parts Cleaning Platform Table of the invention where the main elements of base, frame and legs are shown.

Referring now to the drawings, namely, to FIGS. 1–6, there is shown an apparatus for cleaning parts in a production line where the part is placed on the apparatus adjustably at an ergonomically comfortable height and angle with respect to the worker, thus avoiding fatigue while at the same time providing a faster turn-around time in the production line, and is especially suited for a semiconductor manufacturing line.

Specifically, FIG. 1 shows a perspective view of the disclosed apparatus comprising three main parts: base (10), tiltable platform (30), and legs that connect the base to the platform. The base platform comprises four corners, (A), (B), (C) and (D) while the legs have upper portions (20a) that slide in and out of lower portions (20b), where the suffix () takes the letter of the corresponding corner. Thus, (20aA) designates the upper portion of that leg which is closest to corner (A), while (20bC) refers to the lower portion of the leg that is on the side of corner (C). The lower portions 20(b) are braced to the base with braces (40), as shown in the same Figure, where, similarly, (40B) refers to the brace holding the leg that is on the side of corner (B).

It is a main feature and key aspect of the present invention that platform (10) is tiltable. The tilt is enabled by sliding the upper portions of the legs up and down, where in FIG. 1 the rear leg is raised more than the front leg, while the legs on the right and left are at the same elevation. It is important that both front and rear legs have a sliding hinge, allowing the table to be tilted towards and away from worker. Thus, noting the corners of table (50) shown in FIG. 1 as (A), (B), (C) and (D), then it will be apparent that the table rotates along axis (BD) without any translation while axis (AC) tilts "up and down" without any rotation. The preferred tilt angle is between about 30 to 50 degrees.

It will be appreciated by workers in the field that in addition to the tilt, the height of the workpiece placed on the tiltable platform is also important in terms of the ease with which the worker can work without fatigue. In other words, in addition to the orientation of the workpiece, the amount of stretching or bending to reach the workpiece will contribute to the fatigue experienced by the worker. Based on the experience in the present FAB line, it is preferred that the height of the platform can be varied between about 10 to 16 inches. A simple increase in height, without any tilt of the platform, can be achieved by raising all four legs by the same amount, and holding it there by certain means. This is accomplished by moving the upper portions of the legs, (20a), by a certain amount, and then, in this preferred embodiment, lining up holes that are formed both in the upper and lower portions of the legs, namely, (60a), and (60b), respectively, as better seen in FIG. 2, and inserting plans (70) into the holes to hold the legs at the desired height. For example, pin (70D) holds the leg near corner (D) of the platform at a certain height by going through holes (60aD) in upper portion (20aD) and (60bD) in lower portion (20bD) of that leg. When a tilt is also desired, then the appropriate legs (front and rear legs in FIG. 1) are further raised or lowered to achieve the desired tilt and an average height that is commensurate with the worker's ergonomic needs.

Figure 3A:
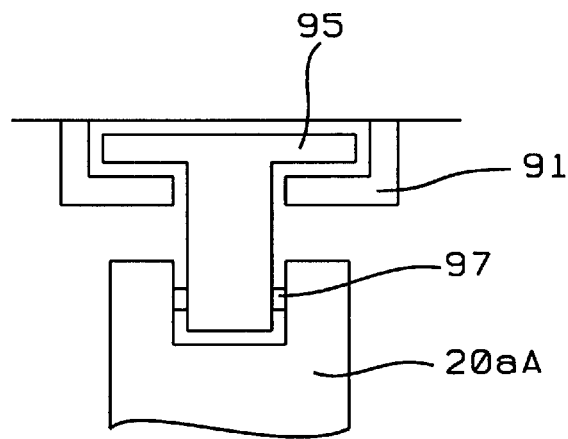
FIG. 3a is a cross-section of the sliding pivot on the tilting axis of the platform of the present invention.
Figure 3B:
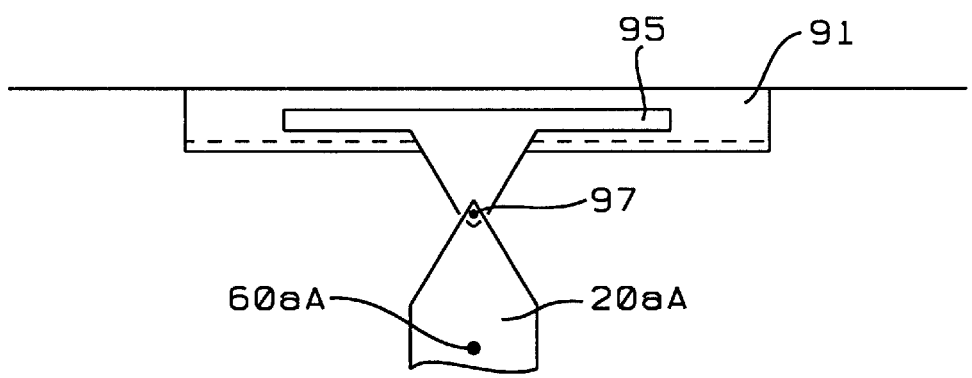
FIG. 3b is a side view of FIG. 3a, according to the present invention.
Figure 3C:
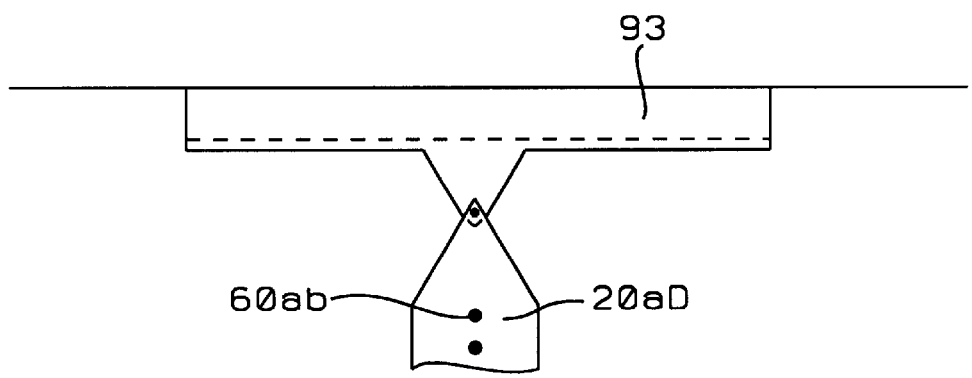
FIG. 3c is a cross-section of the non-sliding pivot on the rotating axis of the platform of the present invention.

In order to accommodate the "up and down" tilt of the axis (A–C), it is important that the legs supporting the (A)–(C) axes have sliding pivots as shown in FIGS. 3a and 3b. In FIG. 3a, the leg nearest to corner (A) is shown, and FIG. 3b is a side view of FIG. 3a. Member (95) not only pivots about point (97), but also slides in railing (91) along the axis (A–C) as frame (50) is tilted about axis (B–D). In this manner, the sliding accommodates the shortening and extending of the distance between base (10) and platform (50) through tilting. FIGS. 3a and 3b show the leg nearest the corner (A) A similar figure can be drawn for the leg nearest to corner (C). However, it will be noted from FIG. 3c that for the legs that are on the (B–O) axis, there is no sliding required, as there is no upward or downward translation of the platform along that axis, but only rotation.

Figure 4:
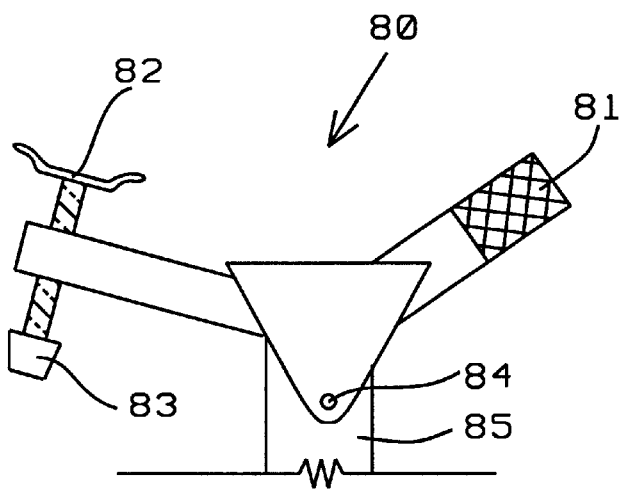
FIG. 4 is a schematic drawing of a clamp with a rubber tip used in the Parts Cleaning Platform Table of the invention for securing parts to the railing of the platform.
Figure 5:
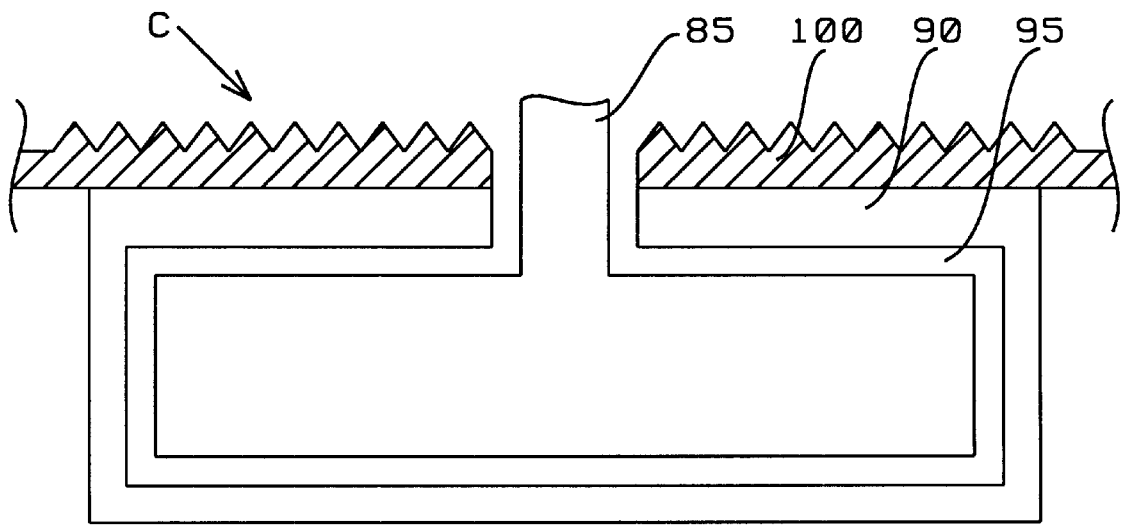
FIG. 5 is a cross-sectional view at (C) of the Parts Cleaning Platform Table of the invention showing the grooved channel where a clamp may be slid in order to position the clamp anywhere along the length of the railing, and also where a serrated surface is provided over the channel in order to secure the part without damage when the rubber tip of the clamp is pressed against it, according to the present invention.

The workpiece is held on the tiltable platform by means of clamps which are adjustable to accommodate the size of the part. Clamps (80) are shown in FIG. 1, where they are slidably positioned on two railings (91) and (93) fitted on frame (50). An enlarged view of the clamps is shown in FIG. 4. The clamp has a handle (81) to move a head with tip (83) rotatably around pivot (84), and lock it in the railing. It is important that tip (83) comprises rubber so as to not damage the part that is clamped onto a channel in the railing, as will be described further. Furthermore, the rubber tip can be advanced up and down by turning a wing-nut (82) that is attached to the rubber tip via a screw as shown in FIG. 4.

The railings arc is made an integral part of the frame diagonally spanning the opposite corners (A), (C) and (B), (D) of the frame as shown in FIG. 1. The railings are machined to have channel (100) where the clamps can be slid in. This is better seen in FIG. 5 which shows the end of the channel corresponding to corner (C) in FIG. 1. The bottom portion of clamp (80) is shown with reference numeral (85) in both FIGS. 4 and 5. The clamps, therefore, can be positioned along any point in the railing by sliding the clamp in channel (95) shown in FIG. 5.

Figure 2:
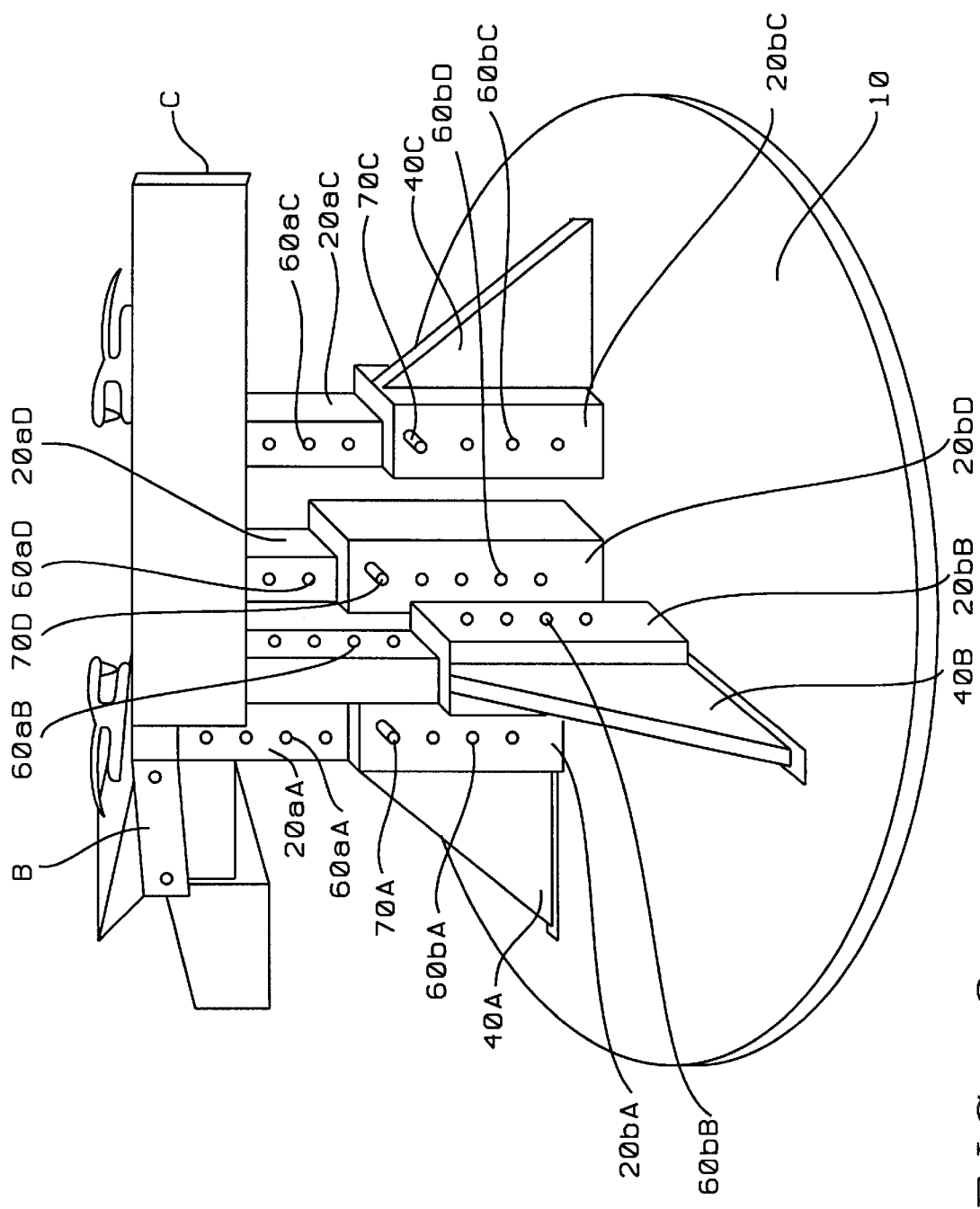
FIG. 2 is a side perspective view of the Parts Cleaning Platform Table of the invention where the four corners of the platform and its tilt are shown.
Figure 6:
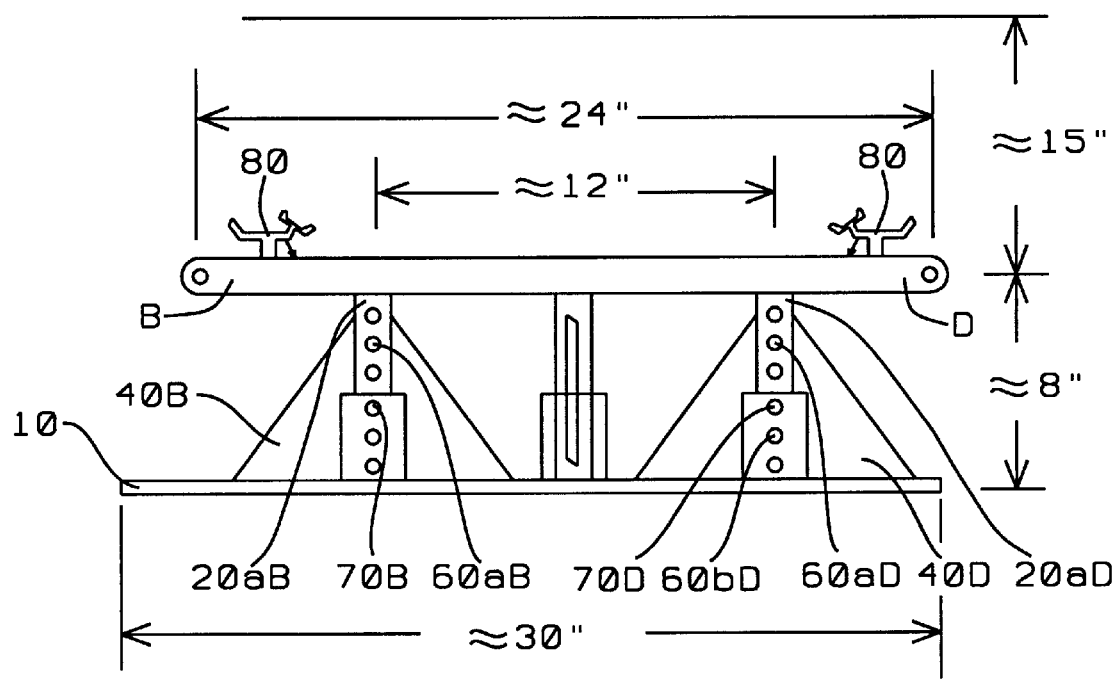
FIG. 6 is a schematic of the Parts Cleaning Platform Table of the invention showing its preferred dimensions for application in a semiconductor production line, according to the present invention.

The parts cleaning platform table of the invention disclosed in FIGS. 1 and 2 can be made from stainless steel, steel, wood or plastic depending upon the use. It is preferred that for the semiconductor manufacturing line, the parts be made out of polypropylene plastic. The dimensions will also vary depending upon the application and the size of the parts to be cleaned. For the present production line it is preferred that the frame of the platform is a square with an edge about 24 inches long, and the spacing between the non-pivoting legs is about 12 inches, where the legs are attached to a base of a diameter of approximately 30", as shown in the schematic of FIG. 6. Further, the platform can be raised or lowered by placing pin (70) in the appropriate hole in legs (20) (comprising upper portion (20a) and lower portion (20b)) and also tilted from about 8 inches in the front to about 15 inches in the back, and vice versa, as shown in the same Figure.

Hence, a method of cleaning semiconductor parts, say, by beading, sand-blasting or $CO_2$ blasting comprises the steps of placing the part on the platform, sliding the clamps to the edge of the part, clamping down the part, raising the platform table to an ergonomically desirable height, tilting the platform to optimally clean the part, and performing the cleaning. It will be appreciated that other parts may also be cleaned using the tiltable platform as the clamps are adjustable to accept various shapes and sizes. Also, the frame of the platform need not be a square, but could be any shape to accommodate different parts. It will also be appreciated that the worker fatigue is minimized as the part can be cleaned until it is satisfactory, without dropping or breaking it, and hence lessening scrap, and improving turn-around-time.

While the invention has been particularly shown and described with reference to the preferred embodiments thereof, it will be understood by those skilled in the art that various changes in form and details may be made without departing from the spirit and scope of the invention.

What is claimed is:

1. A platform table comprising:
   a base comprising a plurality of legs affixed onto said base;

a tiltable platform disposed over said plurality of legs;

said tiltable platform comprising a frame having four edges and four corners;

said tiltable platform pivotably disposed on a pivot on a pivot let of one of said plurality of legs, and on the remaining plurality of legs;

said tiltable platform further having two railings spanning opposite said corners and forming a cross at the center of said frame; and clamps that are disposed slidably over said railings.

2. The platform table of claim 1, wherein said base is circular.

3. The platform table of claim 1, wherein the number of said plurality of legs is at least four.

4. The platform table of claim 3, wherein said plurality of legs of at least four are secured to said base by means of braces.

5. The platform table of claim 1, wherein said four edges of said frame are perpendicular to each other, and form a square.

6. The platform table of claim 1, wherein the height of said plurality of legs is adjustable.

7. The platform table of claim 1, wherein said plurality of legs have an upper portion and a lower portion.

8. The platform table of claim 1, wherein each said lower portion of said plurality of legs is hollow and accepts a corresponding upper portion of said plurality of legs.

9. The platform table of claim 1, wherein said upper portion of said legs is slidable inside said hollow said lower portion of said plurality of legs.

10. The platform table of claim 1, wherein said pivot is formed at one of said corners of said frame.

11. The platform table of claim 1, wherein said tiltable platform is disposed over said remaining plurality of legs at proximity to said center and away from said corners of said frame.

12. The platform table of claim 1, wherein said tiltable platform can be tilted in any direction about said pivot by adjusting the height of said plurality of legs.

13. The platform table of claim 1, wherein said railings have grooved channels with an edge to accept said adjustable clamps.

14. The platform table of claim 1, wherein said adjustable clamps are slidably disposed within said grooved channels.

15. The platform table of claim 1, wherein said adjustable clamps have a rubber tip.

16. The platform table of claim 1, wherein said platform can be adjusted vertically from said base between about 14 to 16 inches.

17. The platform table of claim 1, wherein said base has a diameter between about 29 to 31 inches.

18. The platform table of claim 3, wherein said legs of four are spaced at 12 inches.

* * * * *